United States Patent [19]
Takayama

[11] Patent Number: 5,903,055
[45] Date of Patent: May 11, 1999

[54] CONDUCTOR LINE MATERIALS AND METHOD OF MAKING THEIR METAL LINE LAYERS

[75] Inventor: Shinji Takayama, Mitaka, Japan

[73] Assignee: International Business Machines Corporation, Armonk, N.Y.

[21] Appl. No.: 08/612,725

[22] Filed: Apr. 8, 1996

[30] Foreign Application Priority Data

Aug. 8, 1995 [JP] Japan .................................. 7-048861

[51] Int. Cl.⁶ .................................................. H01L 29/43
[52] U.S. Cl. .................... 257/771; 438/688; 148/439; 148/440
[58] Field of Search .................................. 438/688, 598, 438/660, 622; 148/439, 440; 257/771, 768, 769

[56] References Cited

U.S. PATENT DOCUMENTS

| | | |
|---|---|---|
| 4,713,258 | 12/1987 | Umemura . |
| 5,076,865 | 12/1991 | Hashimoto et al. . |
| 5,509,978 | 4/1996 | Masumoto et al. . |
| 5,514,909 | 5/1996 | Yamamoto et al. . |
| 5,521,107 | 5/1996 | Yamazaki et al. . |
| 5,593,515 | 1/1997 | Masumoto et al. . |

FOREIGN PATENT DOCUMENTS

| | | |
|---|---|---|
| 0542271 | 5/1993 | European Pat. Off. . |
| 0545327 | 6/1993 | European Pat. Off. . |
| 56-084440 | 7/1981 | Japan . |
| 745555 | 2/1995 | Japan . |
| 1292508 | 10/1972 | United Kingdom . |

OTHER PUBLICATIONS

J. Leszczynski, et al. "Columnar equiaxed change in superpure aluminum containing transition metal additions" Metal. Sci. vol. 8 No. 1 (1974) pp. 5–8, no month.

Primary Examiner—Caridad Everhart
Attorney, Agent, or Firm—Ronald L. Drumheller

[57] ABSTRACT

A conductor line material is provided which has an extremely low electric resistance such as 10 $\mu\Omega\cdot$cm or less, and in preferred embodiments, about 5 $\mu\Omega\cdot$cm, which causes no defect such as hillocks and pinholes even at high temperatures, and which easily forms strong insulation films by anodic oxidation. An Al-based conductor line material comprising an alloy whose composition formula is substantially expressed by $Al_x(M_yN_{1-y})_{1-x}$, where M represents at least one element selected from a group consisting of rare-earth elements, N represents at least one element selected from a group consisting of Nb, Zr and Ta, x is between 98 and 99.5 atomic percent, and y is a number between 0.1 and 0.9, wherein an intermetallic compound of Al with said element represented by M or N is deposited in the matrix by subsequent heat treatment. The same object may be achieved by an alloy of Al to which 0.5–2.0 atomic percent Nb is added. The temperature of heat treatment in both cases is preferably in a range between 250 and 450° C.

17 Claims, 3 Drawing Sheets

CONDUCTOR LINE MATERIALS AND METHOD OF MAKING THEIR METAL LINE LAYERS

BACKGROUND OF THE INVENTION

1. Field of the Invention

The present invention relates to an electrode conductor line material for electronic devices such as liquid crystal display devices, and more specifically, to a highly corrosion resistant, low resistance electrode conductor line material with a high thermal stability and little defects such as hillocks and pinholes. The present invention also relates to an electrode conductor line material on which a gate insulation film having a high breakdown voltage is formed by forming an oxidized film by anodic oxidation.

2. Related Art:

Pure metals such as Cu, Al, Mo, Ta, and W, or alloy materials such as Al-Cu, Al-Cu-Si, and Al-Pd have been used as electrode conductor line materials having low electric resistance used in electronic devices. However, in electrode conductor line materials for liquid crystal display devices recently attracting public attention as thin display devices, excellent properties different from those of conventional materials, such as large area conductor line for large screens, highly dense conductor line for high resolution, and array fabrication by a high temperature process, are required. FIG. 1 shows a schematic diagram of a pixel in the array of a thin film transistor (TFT) liquid crystal display device. A pixel opening 1 is provided with a display electrode 2, a gate line 3, a gate electrode 3A, a data line 4, a drain electrode 4A, a source electrode 5, and a TFT active element 6. When the TFT is turned on by the signal on the gate line 3, the potential of the data line 4 becomes equal to the potential of the pixel electrode 2 connected through the source electrode 5. As the result, liquid crystals contained in the upper part of the pixel electrode 2 in the paper direction are oriented making the pixel be in the display condition. Here, an array electrode conductor line material of a liquid crystal display device according to the present invention is used in the gate line 3, the gate electrode 3A, the data line 4, the drain electrode 4A, and the source electrode 5.

The properties required in electrode conductor line materials for liquid crystal display devices include a low electric resistance. A high electric resistance causes various problems such as the delay of signals and the generation of heat, especially in manufacturing large liquid crystal display devices. For this reason, pure Al, which has a low electric resistance, has been used as the conductor line material for liquid crystal display devices. Pure Al excels in etching characteristics, and is a suitable material from the point of view of adhesion with the substrate. However, pure Al has disadvantage that it has a low melting point, and easily causes a defect known as hillock during the heating step in the CVD process after the formation of the conductor line film. This heating step is normally performed at a temperature of about 400° C., and when the conductor line material is observed after this step, defects such as small projections and pinholes may be found. Such small projections are called hillocks and if these occur, the flatness of the conductor line material layer is lost, and oxidized films cannot be formed on the conductor line material layer in subsequent steps. The occurrence of hillocks is a very large problem in the manufacture of liquid display devices. Although the mechanism of the occurrence of hillocks has been unknown, it is considered that hillocks occur when a stress in the compression direction is applied to the thin film by heating due to difference in the coefficient of linear expansion between the thin film and the substrate, and Al atoms are driven by this stress and move along grain boundaries.

The occurrence of hillocks may be prevented by using refractory materials such as Cr, Ti, Ta, and MoTa, because the diffusion of atoms along grain boundaries is unlikely to occur. However, all of these refractory materials have as high specific resistance as 50 $\mu\Omega\cdot$cm (about 4 $\mu\Omega\cdot$cm for Al), and their electrical properties are not desirable for conductor line materials. These high resistance materials are not suitable for manufacturing large liquid crystal display devices.

Therefore, the development of Al-based alloy electrode conductor line materials has been tried. Although Al-Cu and Al-Cu-Si alloys were reported in the past, and Al-Ta and Al-Zr alloys were reported recently, these were not satisfactory in both the occurrence of hillocks at a high temperature of 300° C. or above, and high electric resistance.

FIG. 2 shows a cross-sectional structure of a liquid crystal display device. The glass substrate and conductor line materials formed on the undercoat applied on the substrate are protected from dielectric breakdown during the TFT operation by forming a gate insulation film for isolating them from the transparent electrode, the amorphous silicon layer, and the source/drain electrode. The gate insulation film consists of silicon oxide or silicon nitride, and laminated on the conductor line materials. However, the formation of such an oxide or nitride layer consisting of multiple layers requires complicated process steps, and if the layer thus formed has defect, dielectric breakdown may occur.

In order to cope with the complication of the process steps for forming insulation films and the problem of dielectric breakdown, it is desirable to oxidize the electrode conductor line material used in the gate electrode directly by anodic oxidation to form a dense oxidized film, and to replace the above insulation films with such an oxidized film. According to this method, the process for forming the insulation film, which required several steps, may be performed in one step, and the anodic oxidation method is suitable for obtaining dense oxidized films. This is possible when pure Al is used as the conductor line material. Pure Al forms a very dense oxidized film by anodic oxidation. However, as described above, pure Al has the problem of the occurrence of hillocks.

SUMMARY OF THE INVENTION

It is an object of the present invention to provide an electrode conductor line material, in particular an electrode conductor line material used in liquid crystal display devices, which has high thermal stability, little occurrence of defects such as hillocks, and low electric resistance, and forms a dense insulation film easily by anodic oxidation.

The object of the present invention is achieved by depositing in a matrix an intermetallic compound of Al and a rare-earth element formed by the heat treatment of an alloy whose composition formula is substantially expressed by $Al_x(M_yN_{1-y})_{1-x}$, where M represents at least one element selected from a group consisting of rare-earth element, N represents at least one element selected from a group consisting of Nb, Zr, and Ta, x is between 98 and 99.5 atomic percent, and y is preferably a number between 0.1 and 0.9.

The object of the present invention is also achieved by depositing in a matrix an intermetallic compound of Al and a rare-earth element formed by the heat treatment of an alloy of Al containing 0.5–2.0 atomic percent of Nb. The temperature of heat treatment in both cases is preferably in the range between 250 and 450° C., and the electric resistance is 10 $\mu\Omega\cdot$cm or below, and in the preferred embodiment, about 5 $\mu\Omega\cdot$cm. The mixing of impurities unavoidable in metallurgy is not beyond the scope of the present invention.

DESCRIPTION OF THE PREFERRED EMBODIMENTS

Figure 1:
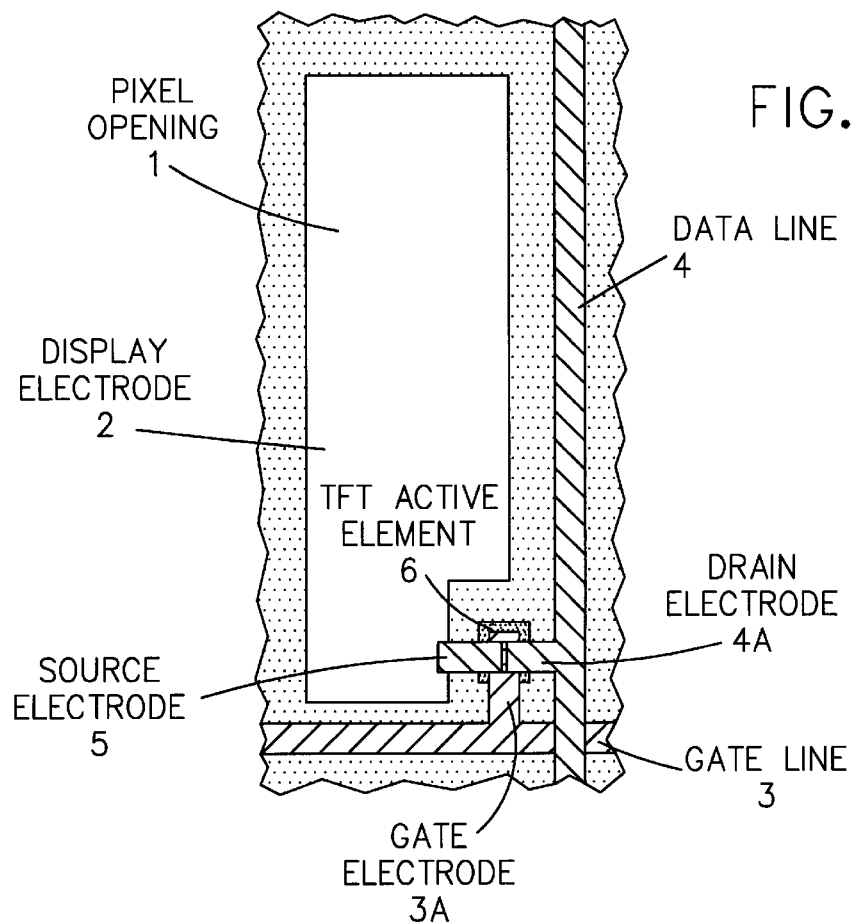
FIG. 1 shows a top view of a pixel portion of a liquid crystal display device.
Figure 2:
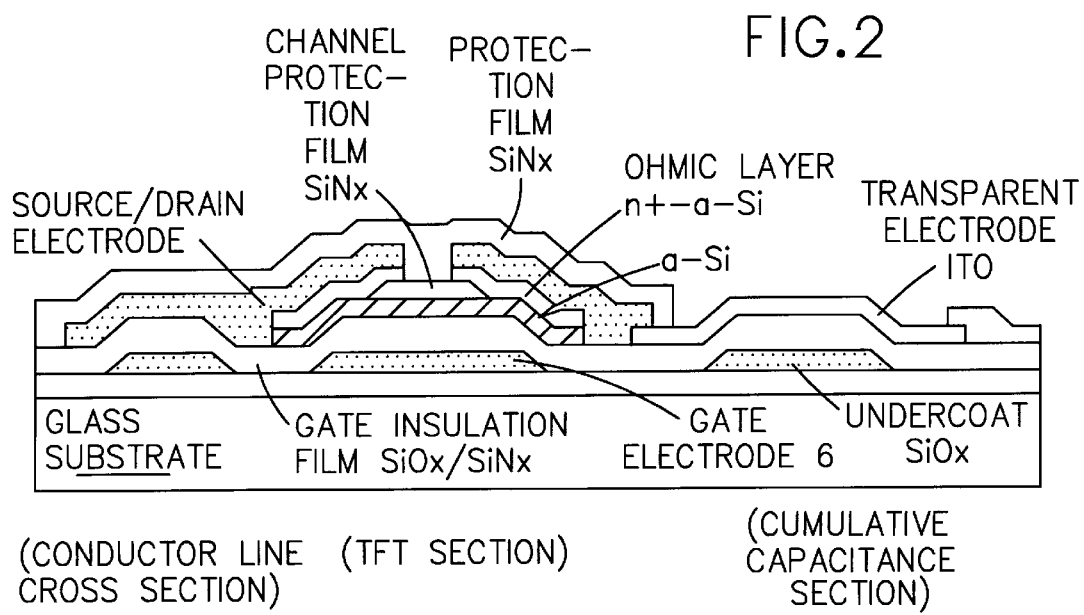
FIG. 2 shows a sectional view of a pixel portion of a liquid crystal display device.

In the present invention, the above properties are achieved by adding an additive element to Al. In general, the electric resistance of Al increases significantly when an additive element is added. This tendency is high when the additive element forms a solid solution in Al. Therefore, the element that improves heat stability and prevents defects such as hillocks by the addition of a trace amount was searched, and decrease in electric resistance was tried by depositing an intermetallic compound of Al by the heat treatment of the solute additive element in a state of solid solution.

Specifically, it was found to give good results to add rare-earth elements such as Y, La, Pr, Nd, Gd, Dy, Ho, Er, a part of which is then substituted by a refractory metal element such as Nb, Zr, and Ta. At least one of each of these rare-earth elements and refractory metal elements was added to Al in a total amount of 0.5–2.0 atomic percent, and solute atoms was deposited as an intermetallic compound with Al by heat treatment in the range between 300 and 450° C. By this an extremely excellent conductor line material for liquid crystal display devices which has little defects such as hillocks and pinholes, and extremely low electric resistance was obtained. According to the present invention, as described above, the heat treatment of the conductor line material is essential. This is because the solute atoms dissolved in the matrix are deposited in the matrix in the form of an intermetallic compound with Al, electric resistance is decreased by decreasing the concentration of atoms dissolved in the matrix, and the deposited intermetallic compound prevents defects such as hillocks from occurring by restricting the movement of atoms at high temperatures. It is therefore important that the intermetallic compound is deposited in the matrix, and the temperature of heat treatment is merely a guideline. Therefore, although the desired object is achieved by heat treatment at a temperature up to 500° C., which is higher than the temperature described above, further higher temperatures are not desirable because such temperatures will cause the production of coarse particles, the occurrence of excessive thermal stress in the conductor line material, and the occurrence of defects such as hillocks.

As the result, the conductor line material obtained has little defects such as hillocks at as high temperature as 350° C. or more, and the electric resistance is 4–6 $\mu\Omega\cdot$cm which is equivalent to or about twice that of pure Cu. For electric resistance, since the best of conventional conductor line materials with little occurrence of hillocks has a resistance of about 8 $\mu\Omega\cdot$cm which is almost three times as high as that of pure Al (Al-Ta system), it is obvious that the conductor line material of the present invention has much better properties than conventional known materials.

The occurrence of hillocks may be prevented even by materials to which no refractory metal element is added. However, if no refractory metal element is added, oxidation resistance is poor, and corrosion resistance is also low. Therefore, the addition of an element such as Nb, Zr, and Ta is required.

The inventors of the present invention discovered that the addition of these elements increased significantly the breakdown voltage of the formed anodically oxidized film. That is, the addition of a refractory metal element is considered to densify the anodically oxidized film, and improve its dielectric breakdown characteristics. It is therefore possible that the process for manufacturing liquid crystal display devices, which formed multiple layers of insulation films after wiring, is shortened by anodically oxidizing the conductor line material thus obtained. It was also found that corrosion resistance was improved by adding these elements. It was further found that corrosion resistance and oxidation resistance were improved by adding a well-balanced amount of these elements while maintaining desirable properties of the alloy to which rare-earth elements were added, such as the occurrence of hillocks and electric resistance.

The composition of the conductor line material according to the present invention may also be described as the composition whose composition formula is expressed by $Al_xM_{1-x}$ (where M represents at least one element selected from a group consisting of rare-earth elements, and x is between 98 and 99.5 atomic percent), a part of the rare-earth elements is substituted by at least one selected from a group consisting of Nb, Zr, and Ta.

The inventors of the present invention also studied if the same effect is obtained without adding rare-earth elements. The results showed that an alloy which has a low electric resistance and a low possibility of the occurrence of hillocks, and may form a strong insulation film by anodic oxidation may be formed from the Al-Nb alloy system. The amount of Nb added is between 0.5 and 2.0 atomic percent, and as in the ternary alloys to which rare-earth elements are added, heat treatment if performed at a temperature of 250° C. or above. The detail of these methods is shown below together with experimental data.

EXAMPLE 1

An Al alloy thin film of a thickness of about 300 nm was formed by vapor deposition or sputtering using a composite target of an alloy produced by mixing at least one element selected from a group consisting of Y, Nd, and Gd, and at least one element selected from a group consisting of Zr, Nb, and Ta with Al, or a composite target comprising the chip of the above elements formed on an Al plate. Table 1 shows the specific resistance and the number of hillocks of Al alloy films heat-treated in vacuum at 350° C. for one hour, and the breakdown voltage of films formed by anodically oxidizing the alloy films. For comparison, the results of thin films consisting of Al element alone and alloy films consisting of Al and additive elements in a total amount more than 0.5 atomic percent and less than 2 atomic percent.

TABLE 1

| Composition | Specific resistance ($\mu\Omega \cdot cm$) | Occurrence of hillocks | Breakdown voltage (MV/cm) |
|---|---|---|---|
| Comparative example | | | |
| Al | 3.6 | many | 7.8 |
| Example | | | |
| Al99(Nd0.7Zr0.3)1 | 5.6 | none | 7.5 |
| Al98(Nd0.5Ta0.5)2 | 6.2 | little | 7.0 |
| Al98.5(Nd0.4Nb0.6)1.5 | 5.7 | none | 7.7 |
| Al98.7(Y0.7Nb0.3)1.3 | 6.1 | none | 6.9 |
| Al99(Y0.5Zr0.5)1 | 5.6 | none | 7.6 |
| Al98.2(Y0.4Ta0.6)0.8 | 5.5 | none | 7.4 |
| Al98(Gd0.7Ta0.3)2 | 6.0 | none | 7.0 |
| Al99(Gd0.5Nb0.5)1 | 5.4 | none | 7.0 |
| Al98.5(Gd0.4Zr0.6)1.5 | 5.8 | none | 7.6 |
| Comparative example | | | |
| Al97(Nd0.7Ta0.3)3 | 15.0 | none | 6.5 |
| Al99.6(Nd0.7Ta0.3)0.4 | 6.0 | many | 7.5 |
| Al99.8(Y0.7Zr0.3)0.2 | 5.0 | many | 7.5 |
| Al97.5(Gd0.5Nb0.5)2.5 | 18.0 | none | 6.5 |

As Table 1 shows, the Al alloy thin film of the present invention has a high heat stability, little defects, high reliability, and an extremely low resistance, and is most suitable for the TFT electrode conductor line material for liquid crystal display devices. As shown in the table, in the alloy having the composition formula of $Al_x(M_yN_{1-y})_{1-x}$, good results are obtained when 1−x is in between 0.5 and 2 atomic percent. If 1−x is smaller than this range, the occurrence of hillocks increases, and if 1−x is larger than this range, electric resistance increases. Large change in breakdown voltage is not observed within a wide range of composition, and in preferred embodiments, breakdown voltage decreases by 15 percent or less from the breakdown voltage of pure Al. If the amount of additive elements is increased to 1−x=2.5, the thin film tends to deteriorate.

The ratio of a rare-earth element M and a refractory metal element N gives good properties in a wide range. When the amount of the rare-earth element is larger or the amount of the refractory metal element is larger, good properties may be obtained if 1−x is within the above adequate range. However, it has been known that the rare-earth element alone does not provide favorable anodic oxidation and good corrosion resistance, and an extremely small amount of the refractory metal element may cause problems. In contrast, if the amount of the rare-earth element is extremely small, there is possibility not to cause serious problems when the fact that the Al-Nb binary system exhibits good properties as the following embodiment shows is considered. Although only Y, Nd, and Gd are shown as rare-earth elements, the same effects are expected by other rare-earth elements such as La, Pr, Sm, Dy, Ho, and Er. Rare-earth elements, especially a group of elements belonging to the lanthanide group have the same number of electrons in outermost and second outermost shells, and their chemical characteristics are similar to each other. In fact, it has been confirmed that the binary system with Al has the same effect on the prevention of hillocks (Docket No. JA995-017 filed by the applicant of the present invention on the same day as this application and entitled "A CONDUCTOR LINE MATERIAL AND A CONDUCTOR LINE LAYER").

Figure 3:
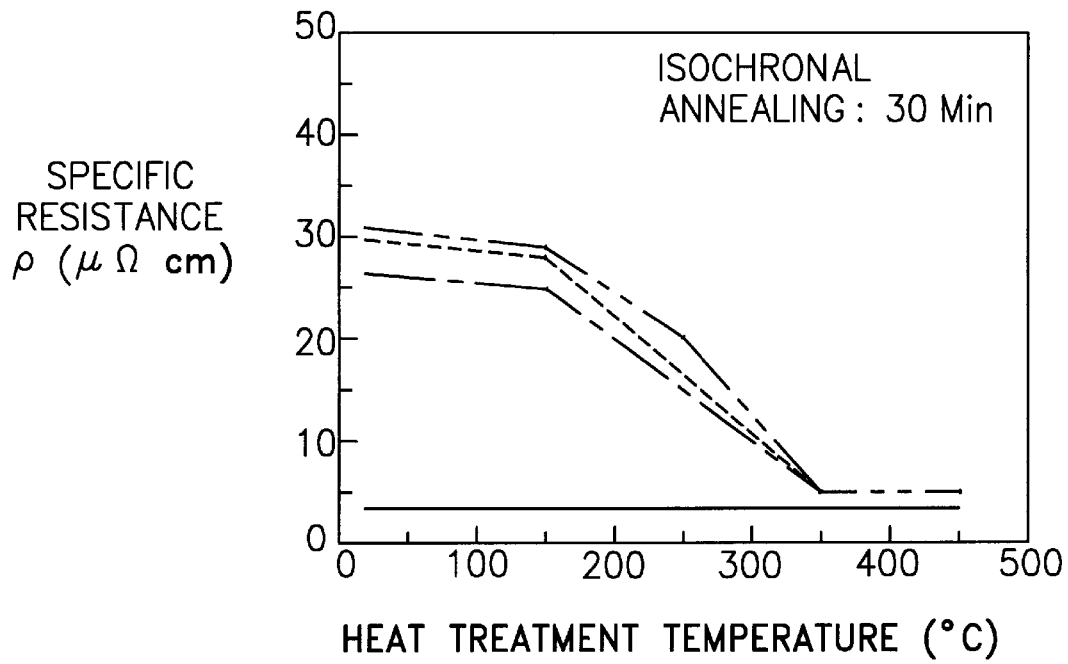
FIG. 3 shows a graph illustrating relationship between heat treatment temperature and specific resistance of an embodiment of the present invention when heat treatment time is constant 30 min.

FIG. 3 shows relationship between heat treatment temperature and electric resistance of typical alloys of the present invention. The uppermost curve is of $Al_{99}$ $(Nd_{0.7}Zr_{0.3})_1$, the second is of $Al_{98.2}(Y_{0.4}Ta_{0.6})_{1.8}$, the third is of $Al_{99}(Gd_{0.5}Nb_{0.5})_1$, and the lowermost curve is of pure Al. The marked decrease in electric resistance is seen with increase in heat treatment temperature. It is therefore required to perform heat treatment at a temperature of 250° C. or above, and preferably between 300 and 400° C. Excessively high heat treatment temperature, e.g., 500° C. is not desired because such a high temperature may increase the occurrence of hillocks and cause coarse particles to form.

Figure 5:
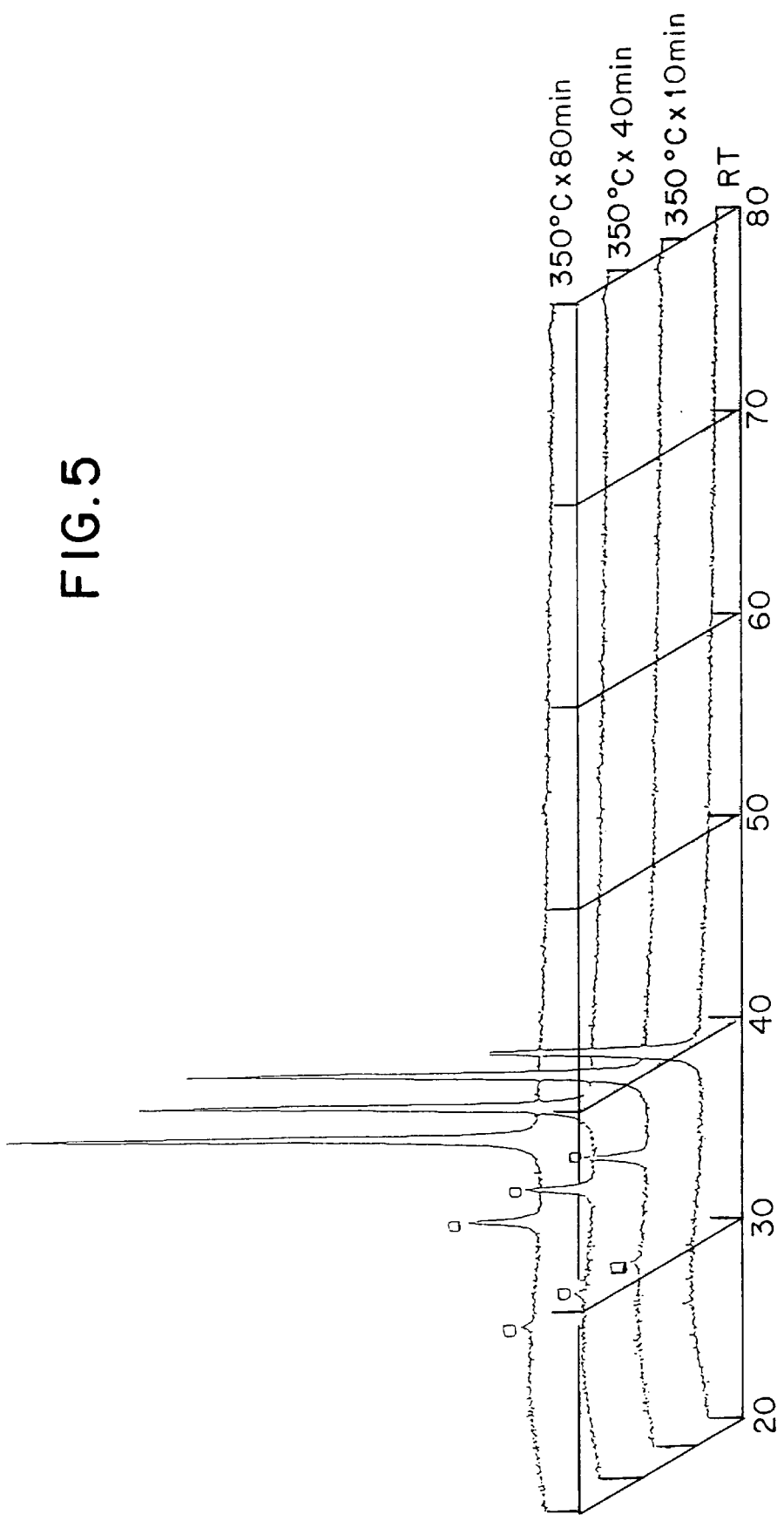
FIG. 5 shows an X-ray diffraction profile of an embodiment of the present invention heat-treated at 35° C.

FIG. 5 shows an X-ray diffraction chart of $Al_{99}$ $(Nd_{0.7}Zr_{0.3})_1$, an embodiment of the present invention, heat-treated at 350° C. The appearance of peaks (□), which were not present before heat treatment, is considered to correspond to the deposition of intermetallic compounds. The reason for such decrease in electric resistance due to heat treatment is that the solute atoms (rare-earth and refractory metal elements) dissolved in the matrix react with the base Al to form intermetallic compounds, resulting in decrease in solute atoms dissolved in the matrix. Refractory metals such as Nb and Zr are also elements to form intermetallic compounds with Al easily. It is obvious that such microscopic internal change contributes to decrease in the occurrence of hillocks. It has been known that the occurrence of hillocks tends to decrease when an intermetallic compound of Al with any element deposits. However, the addition of any known element does not decrease the occurrence of hillocks dramatically as the addition of rare-earth elements. In this aspect, the mechanism of hillock prevention is considered not only by the deposition of intermetallic compounds, but also by some unknown mechanism based on the inherent nature of rare-earth metal elements.

EXAMPLE 2

Thin films of Al alloys of a thickness of about 300 nm were prepared by vapor deposition and sputtering using composite targets made of alloys formed by mixing Al and Nb so that the desired film composition was obtained, and of Al plates on which Nb chips were provided. Table 2 shows the specific resistance of typical Al-Nb alloys after heat treatment in vacuum at 350° C. for one hour, the density of the number of hillocks (8 μm W×1 mm L), and breakdown voltage of anodically oxidized films of a thickness of 200 nm. For comparison, the results of thin films consisting of Al element alone and alloy films consisting of Al and additive elements in a total amount more than 0.5 atomic percent and less than 2 atomic percent.

TABLE 2

| Composition | Specific resistance ($\mu\Omega \cdot cm$) | Occurrence of hillocks | Breakdown voltage (MV/cm) |
|---|---|---|---|
| Comparative example | | | |
| Al | 3.6 | 300 | 7.8 |
| Example | | | |
| Al98Nb2 | 6.2 | 10 | 7.7 |
| Al98.5Nb1.5 | 5.7 | 15 | 7.8 |
| Al99Nb1 | 5.6 | 20 | 7.8 |
| Comparative example | | | |
| Al97.5Nb2.5 | 15.0 | 7 | 7.0 |
| Al99.7Nb0.3 | 5.3 | 200 | 7.6 |

As Table 2 shows, good results are obtained when the concentration of Nb is between 0.5 and 2.0 atomic percent. The addition of Nb in this range lowers the good breakdown voltage of pure Al very little. If the concentration of Nb is as high as 2.5 atomic percent, the alloy is difficult to use as a conductor line material due to a high specific resistance, and the tendency of decrease in breakdown voltage is found. If the concentration of Nb is less than 0.5 atomic percent, the occurrence of hillocks is not improved.

Figure 4:
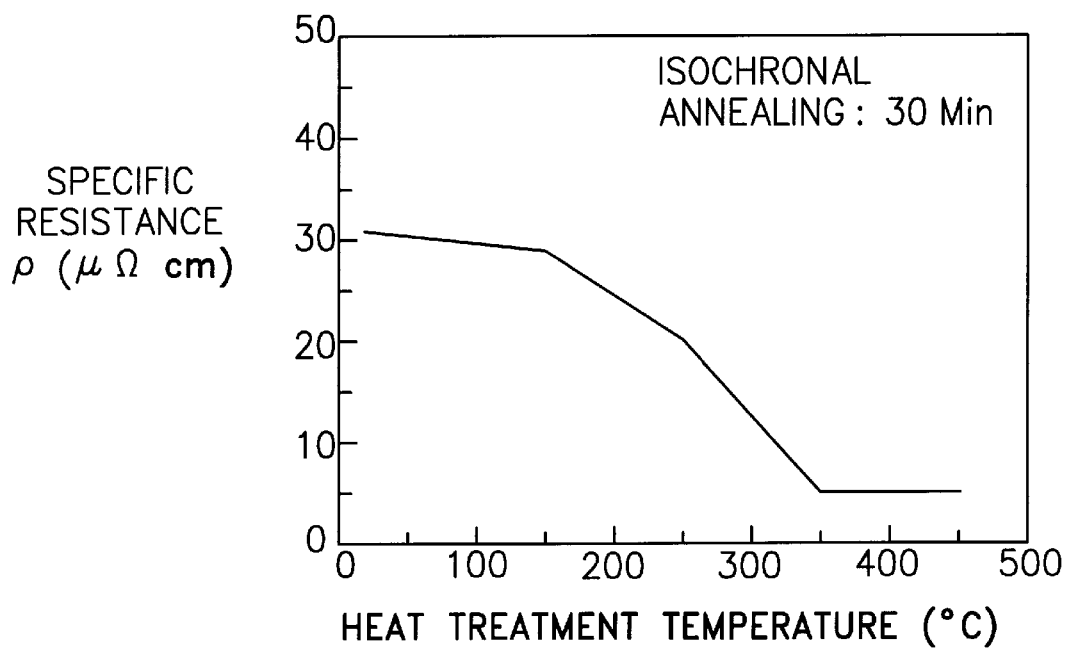
FIG. 4 shows a graph illustrating relationship between heat treatment temperature and specific resistance of another embodiment of the present invention when heat treatment time is constant 30 min.

FIG. 4 shows change in specific resistance of a typical alloy film of the present invention consisting of Al containing 1 atomic percent Nb after heat treatment in vacuum at 350° C. It is seen that heat treatment temperature must be at least 250° C., and preferably, 350° C. or above. The disadvantage of heat treatment at high temperatures is the same as in Example 1.

Although the conductor line material of the present invention is described as a material for conductor line within a liquid crystal display device, this is only for the illustrative purpose, and it may be used in other applications which have similar requirements of (1) low electric resistance, and (2) free of defects such as hillocks caused by high temperature. The conductor line material of the present invention is more suitable for applications which require the insulation of conductor line. Therefore, it is applicable to the conductor line material for semiconductor devices. It is also effective for achieving the object of the present invention to add elements studied for the same type of conductor line materials, such as Cr, Ti, Mo, W, Si, and Cu, to the extent that these elements do not affect the electrical properties and the occurrence of hillocks. The object of the present invention may be achieved when the total amount of these elements does not exceed 0.1 percent.

The present invention provides a conductor line material which has an extremely low electric resistance such as 10 $\mu\Omega$·cm or less, and in preferred embodiments, about 5 $\mu\Omega$·cm, causes no defect such as hillocks and pinholes even at high temperatures, and easily forms strong insulation films by anodic oxidation.

I claim:

1. An Al-based conductor line material whose composition formula is substantially expressed by $Al_xM_{1-x}$ (where M represents at least one element selected from a group consisting of rare-earth elements and x is between 98 and 99.5 atomic percent), a part of said rare-earth elements being substituted by at least one element selected from a group consisting of Nb, Zr, and Ta, said Al-based conductor line material being heat-treated at a temperature between 250 and 450° C.

2. An Al-based conductor line material comprising an alloy whose composition formula is substantially expressed by $Al_x(M_yN_{1-y})_{1-x}$, where M represents at least one element selected from a group consisting of rare-earth elements, N represents at least one element selected from a group consisting of Nb, Zr, and Ta, x is between 98 and 99.5 atomic percent, and y is a number between 0.1 and 0.9, said alloy being heat-treated at a temperature between 250 and 450° C.

3. An Al-based conductor line material comprising an alloy whose composition formula is substantially expressed by $Al_x(M_yN_{1-y})_{1-x}$, where M represents at least one element selected from a group consisting of rare-earth elements, N represents at least one element selected from a group consisting of Nb, Zr, and Ta, x is between 98 and 99.5 atomic percent, and y is a number between 0.1 and 0.9, wherein an intermetallic compound of Al and said element represented by M or N is formed in the alloy by subsequent heat treatment to adjust the electric resistance of said alloy to 10 $\mu\Omega$·cm or less.

4. A conductor line material consisting essentially of an alloy of Al and 0.5–2.0 atomic percent of Nb, which is heat-treated at a temperature between 250 and 450° C.

5. A conductor line material consisting essentially of an alloy of Al and 0.5–2.0 atomic percent of Nb, wherein an intermetallic compound of Al and Nb is formed in the alloy by heat treating to adjust the electric resistance of said alloy to 10 $\mu\Omega$·cm or less.

6. A conductor line material as set forth in claim 1, wherein a total of 0.1 atomic percent or less of one or more elements selected from a group consisting of Cr, Ti, Mo, W, Si, and Cu is further added, and the electric resistance thereof is adjusted to 10 $\mu\Omega$·cm or less.

7. A conductor line material as set forth in claim 2, wherein a total of 0.1 atomic percent or less of one or more elements selected from a group consisting of Cr, Ti, Mo, W, Si, and Cu is further added, and the electric resistance thereof is adjusted to 10 $\mu\Omega$·cm or less.

8. A conductor line material as set forth in claim 3, wherein a total of 0.1 atomic percent or less of one or more elements selected from a group consisting of Cr, Ti, Mo, W, Si, and Cu is further added, and the electric resistance thereof is adjusted to 10 $\mu\Omega$·cm or less.

9. A conductor line material as set forth in claim 4, wherein a total of 0.1 atomic percent or less of one or more elements selected from a group consisting of Cr, Ti, Mo, W,-Si, and Cu is further added, and the electric resistance thereof is adjusted to 10 $\mu\Omega$·cm or less.

10. A conductor line material as set forth in claim 5, wherein a total of 0.1 atomic percent or less of one or more elements selected from a group consisting of Cr, Ti, Mo, W, Si, and Cu is further added, and the electric resistance thereof is adjusted to 10 $\mu\Omega$·cm or less.

11. An Al-based conductor line material as set forth in claim 1 wherein said Al-based conductor line material is heat-treated at a temperature between 300 and 450° C.

12. An Al-based conductor line material as set forth in claim 2 wherein said Al-based conductor line material is heat-treated at a temperature between 300 and 450° C.

13. An Al-based conductor line material whose composition formula is substantially expressed by $Al_xM_{1-x}$, (where M represents at least one element selected from a group consisting of rare-earth elements and x is between 98 and 99.5 atomic percent), a part of said rare-earth elements being substituted by at least one element selected from a group consisting of Nb, Zr, and Ta, said Al-based conductor line material being formed by vapor deposition or sputtering followed by heat treatment at a temperature between 250 and 450° C.

14. An Al-based conductor line material comprising an alloy whose composition formula is substantially expressed by $Al_x(M_yN_{1-y})_{1-x}$, where M represents at least one element selected from a group consisting of rare-earth elements, N represents at least one element selected from a group consisting of Nb, Zr, and Ta, x is between 98 and 99.5 atomic percent, and y is a number between 0.1 and 0.9, said alloy being formed by vapor deposition or sputtering followed by heat treatment at a temperature between 250 and 450° C.

15. An Al-based conductor line material comprising an alloy whose composition formula is substantially expressed by $Al_x(M_yN_{1-y})_{1-x}$, where M represents at least one element selected from a group consisting of rare-earth elements, N represents at least one element selected from a group consisting of Nb, Zr, and Ta, x is between 98 and 99.5 atomic percent, and y is a number between 0.1 and 0.9, wherein said alloy is formed by vapor deposition or sputtering followed by a heat treatment during which an intermetallic compound of Al and said element represented by M or N is formed in the alloy to adjust the electric resistance of said alloy to 10 $\mu\Omega$·cm or less.

16. A conductor line material consisting essentially of Al and 0.5–2.0 atomic percent of Nb formed by vapors deposition or sputtering followed by heat treatment at a temperature between 250 and 450° C.

17. A conductor line material consisting essentially of Al and 0.5–2.0 atomic percent of Nb formed by vapor deposition or sputtering followed by heat treatment during which an intermetallic compound of Al and Nb forms in the conductor line material to adjust the electric resistance of said alloy to 10 $\mu\Omega$·cm or less.

* * * * *